United States Patent
Wang et al.

(10) Patent No.: US 10,914,993 B2
(45) Date of Patent: Feb. 9, 2021

(54) ELECTROSTATIC PROTECTION METHOD, ELECTROSTATIC PROTECTION APPARATUS, AND LIQUID CRYSTAL DISPLAY

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Jianjun Wang, Beijing (CN); Yuanyuan Liu, Beijing (CN); Min Wang, Beijing (CN); Rui Ma, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/328,686

(22) PCT Filed: Apr. 20, 2018

(86) PCT No.: PCT/CN2018/083908
§ 371 (c)(1),
(2) Date: Feb. 26, 2019

(87) PCT Pub. No.: WO2018/201918
PCT Pub. Date: Nov. 8, 2018

(65) Prior Publication Data
US 2019/0204694 A1    Jul. 4, 2019

(30) Foreign Application Priority Data

May 4, 2017 (CN) .......................... 2017 1 0308087

(51) Int. Cl.
*G02F 1/1362* (2006.01)
*G09G 3/36* (2006.01)
*G09G 3/20* (2006.01)

(52) U.S. Cl.
CPC ..... *G02F 1/136204* (2013.01); *G09G 3/3677* (2013.01); *G02F 2202/22* (2013.01);
(Continued)

(58) Field of Classification Search
CPC .......... G09G 3/3648; G09G 3/36–3648; G02F 1/136204
See application file for complete search history.

(56) References Cited

U.S. PATENT DOCUMENTS 8,947,416 B2    2/2015 Ochiai et al.
9,208,732 B2   12/2015 Kim et al.
(Continued)

FOREIGN PATENT DOCUMENTS

CN    101859548 A    10/2010
CN    102956212 A     3/2013
(Continued)

OTHER PUBLICATIONS

First Chinese Office Action dated Dec. 17, 2018, received for Chinese Application No. 201710308087.2.
(Continued)

*Primary Examiner* — Hang Lin
(74) *Attorney, Agent, or Firm* — Kinney & Lange, P.A.

(57) ABSTRACT

The present disclosure discloses an electrostatic protection method, an electrostatic protection apparatus and a liquid crystal display. The electrostatic protection method includes: monitoring an interface signal of a timing control circuit and/or a level conversion circuit to determine whether the monitored signal is subjected to electrostatic interference; and when the electrostatic interference is detected, adjusting
(Continued)

An interface signal of a timing control circuit and/or a level conversion circuit is monitored to determine whether the monitored signal is subjected to electrostatic interference ⟋∽S210

When the electrostatic interference is detected, a timing control signal output by the timing control circuit to a gate driving circuit of an array substrate is adjusted ⟋∽S220 a timing control signal output by the timing control circuit to a gate driving circuit of an array substrate, wherein the level conversion circuit connects the timing control circuit to the gate driving circuit of the array substrate, and is configured to perform level conversion on an output signal output by the timing control circuit to the gate driving circuit of the array substrate.

8 Claims, 5 Drawing Sheets

(52) U.S. Cl.
CPC ......... *G09G 3/2096* (2013.01); *G09G 3/3648* (2013.01); *G09G 2300/0408* (2013.01); *G09G 2310/0289* (2013.01); *G09G 2310/08* (2013.01); *G09G 2330/04* (2013.01); *G09G 2330/08* (2013.01)

(56) References Cited

U.S. PATENT DOCUMENTS

| | | | |
|---|---|---|---|
| 9,368,962 B2 | 6/2016 | Zhao et al. | |
| 2008/0080107 A1* | 4/2008 | Chow | H01L 27/0251 361/56 |
| 2008/0100560 A1* | 5/2008 | Na | G09G 3/3677 345/101 |
| 2008/0165110 A1* | 7/2008 | Kim | G11C 19/28 345/99 |
| 2008/0218232 A1* | 9/2008 | Jeon | G09G 3/20 327/165 |
| 2009/0256981 A1 | 10/2009 | Yang et al. | |
| 2010/0033453 A1* | 2/2010 | Park | G09G 3/3648 345/204 |
| 2010/0225346 A1* | 9/2010 | Fefer | G01R 31/002 324/762.02 |
| 2013/0050176 A1 | 2/2013 | Kim et al. | |
| 2013/0093373 A1* | 4/2013 | Chen | H02P 29/032 318/400.21 |
| 2014/0062994 A1* | 3/2014 | Chen | G09G 3/3688 345/214 |
| 2015/0049406 A1* | 2/2015 | Besse | H02H 9/02 361/57 |
| 2019/0204694 A1 | 7/2019 | Wang et al. | |

FOREIGN PATENT DOCUMENTS

| | | |
|---|---|---|
| CN | 103149758 A | 6/2013 |
| CN | 103199513 A | 7/2013 |
| CN | 107068092 A | 8/2017 |
| JP | 2008136262 A | 6/2008 |

OTHER PUBLICATIONS

International Search Report and English Translation of Box V of the Written Opinion dated Jul. 11, 2018, received for corresponding PCT Application No. PCT/CN2018/083908.

* cited by examiner

ELECTROSTATIC PROTECTION METHOD, ELECTROSTATIC PROTECTION APPARATUS, AND LIQUID CRYSTAL DISPLAY

CROSS-REFERENCE TO RELATED APPLICATION(S)

This application is the national phase of PCT Application No. PCT/CN2018/083908, filed on Apr. 20, 2018, entitled "ELECTROSTATIC PROTECTION METHOD, ELECTROSTATIC PROTECTION APPARATUS, AND LIQUID CRYSTAL DISPLAY", which in turn claims priority to the Chinese Patent Application No. 201710308087.2, filed on May 4, 2017, entitled "ELECTROSTATIC PROTECTION METHOD, ELECTROSTATIC PROTECTION APPARATUS, AND LIQUID CRYSTAL DISPLAY", which are incorporated herein by reference in their entireties.

TECHNICAL FIELD

The present disclosure relates to the liquid crystal display technology, and more particularly, to an electrostatic protection method, an electrostatic protection apparatus, and a liquid crystal display.

BACKGROUND

The Gate Driver on Array (GOA for short) technique is a technique for directly manufacturing gate driving Integrated Circuits (ICs)), instead of driving wafers manufactured using external silicon chips, on an array substrate. As shown in FIG. 1, a GOA circuit may be directly manufactured around a panel, which reduces production processes, improves the integration of the liquid crystal panel, and reduces the production cost. With the increasing demand for ultra-narrow bezels in modern display products, display products using the GOA technique have an increasing market share.

A Timing CONtroller (TCON for short) is a logic control core of a liquid crystal display circuit, and is responsible for controlling an operation timing of a liquid crystal panel, to control the time to start a scanning driving circuit, converting an input video signal (for example, Low-Voltage Differential Signaling (LVDS for short) into a form of data signal (for example, a mini-LVDS signal or Reduced Swing Differential Signaling (RSDS for short)) used for a data driving circuit, and transmitting the data signal to the data driving circuit to control the data driving circuit to be started at the right time.

SUMMARY

The embodiments of the present disclosure provide an electrostatic protection method, comprising:

monitoring an interface signal of a timing control circuit and/or a level conversion circuit to determine whether the monitored signal is subjected to electrostatic interference; and when the electrostatic interference is detected, adjusting a timing control signal output by the timing control circuit to a gate driving circuit of an array substrate, wherein the level conversion circuit connects the timing control circuit to the gate driving circuit of the array substrate, and is configured to perform level conversion on an output signal output by the timing control circuit to the gate driving circuit of the array substrate.

The embodiments of the present disclosure further provide an electrostatic protection apparatus, comprising:

a detection circuit configured to monitor an interface signal of a timing control circuit and/or a level conversion circuit to determine whether the monitored signal is subjected to electrostatic interference; and a control circuit configured to, when the electrostatic interference is detected, adjust a timing control signal output by the timing control circuit to a gate driving circuit of an array substrate, wherein the level conversion circuit connects the timing control circuit to the gate driving circuit of the array substrate, and is configured to perform level conversion on an output signal output by the timing control circuit to the gate driving circuit of the array substrate.

The embodiments of the present disclosure further provide a liquid crystal display, comprising the electrostatic protection apparatus described above.

BRIEF DESCRIPTION OF THE ACCOMPANYING DRAWINGS

The accompanying drawings are used to provide a further understanding of the technical solutions of the present disclosure, and constitute a part of the specification. The accompanying drawings are used to explain the technical solutions of the present disclosure together with the embodiments of the present application, and do not constitute limitations on the technical solutions of the present disclosure.

FIG. 5-1 is an exemplary diagram of a scenario in which electrostatic interference of a level conversion circuit is monitored (output current is monitored) according to an embodiment of the present disclosure;

FIG. 5-2 is another exemplary diagram of a scenario in which electrostatic interference of a level conversion circuit is monitored (GND is detected) according to an embodiment of the present disclosure;

FIG. 5-3 is still another exemplary diagram of a scenario in which electrostatic interference of a level conversion circuit is monitored according to an embodiment of the present disclosure;

FIG. 6-1 is an exemplary diagram of comparison of a GOA timing control signal when there is no electrostatic interference and a GOA timing control signal when electrostatic interference is detected according to an embodiment of the present disclosure;

Figure 2:
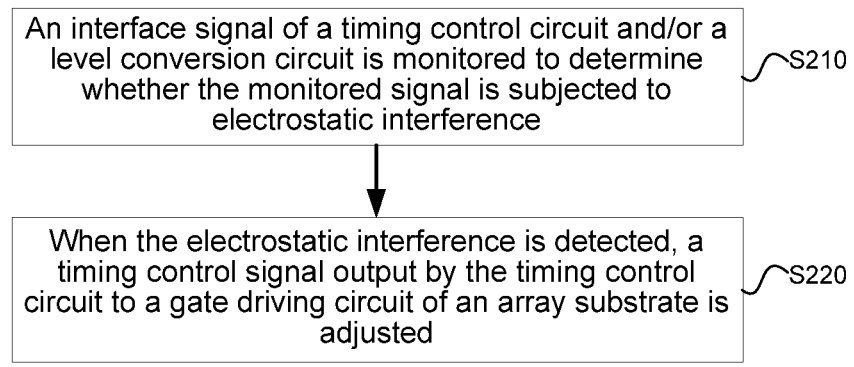
FIG. 2 is an exemplary flowchart of an electrostatic protection method according to an embodiment of the present disclosure.
Figure 3:
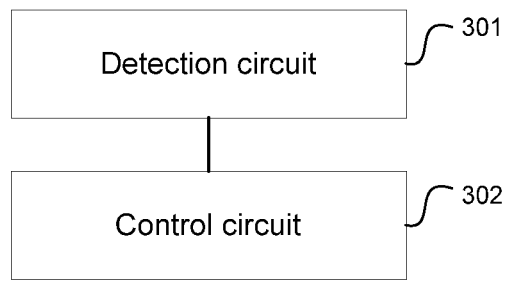
FIG. 3 is an exemplary diagram of an electrostatic protection apparatus according to an embodiment of the present disclosure.
Figures 1, 6:
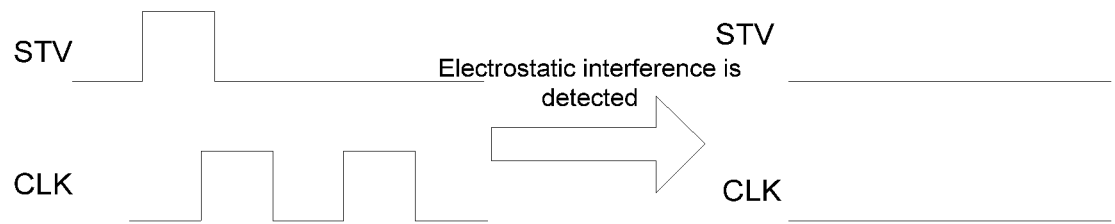
Figures 2, 6:
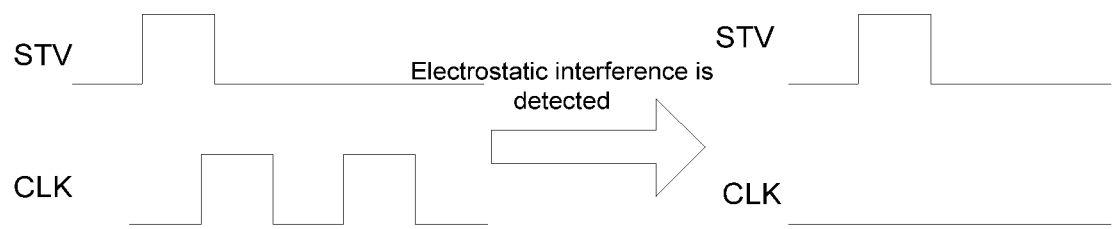
Figures 3, 6:
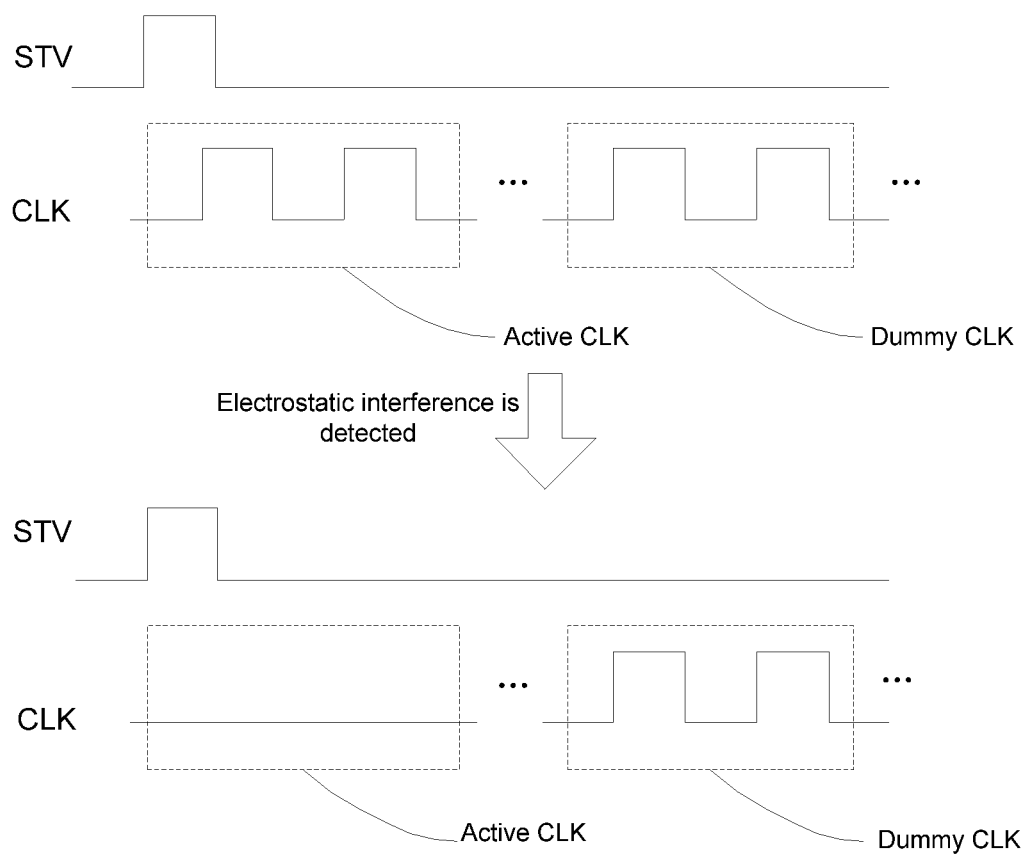

FIG. 6-2 is another exemplary diagram of comparison of a GOA timing control signal when there is no electrostatic interference and a GOA timing control signal when electrostatic interference is detected according to an embodiment of the present disclosure; and FIG. 6-3 is still another exemplary diagram of comparison of a GOA timing control signal when there is no electrostatic interference and a GOA timing control signal when electrostatic interference is detected according to an embodiment of the present disclosure.

DETAILED DESCRIPTION

In order to make the purposes, technical solutions and advantages of the present disclosure more clear and apparent, the embodiments of the present disclosure will be described in detail below with reference to the accompanying drawings. It should be illustrated that, the embodiments in the present application and the features in the embodiments may be arbitrarily combined with each other without a conflict.

The steps illustrated in the flowcharts of the accompanying drawings may be executed in a computer system using, for example, a group of computer executable instructions. Also, although logical orders are shown in the flowcharts, in some cases, the steps shown or described may be performed in a different order from those described herein.

As described above, the GOA technique may be used to directly manufacture a gate driving circuit on an array substrate. However, it should be illustrated that a clock signal output by a timing control circuit TCON to a GOA circuit is easily disturbed by electrostatic interference, which causes a liquid crystal panel to have a screen sweeping phenomenon or display an abnormal screen. Therefore, there is a need for an electrostatic protection method for the GOA technique. As shown in FIG. 2, the embodiments of the present disclosure provide an electrostatic protection method, comprising the following steps.

In S210, an interface signal of a timing control circuit TCON and/or a level conversion circuit is monitored to determine whether the monitored signal is subjected to electrostatic interference.

In S220, when the electrostatic interference is detected, a timing control signal output by the timing control circuit TCON to a gate driving GOA circuit of an array substrate is adjusted.

Here, the level conversion circuit connects the timing control circuit TCON to the gate driving GOA circuit of the array substrate, and is configured to perform level conversion on an output signal output by the timing control circuit TCON to the gate driving GOA circuit of the array substrate.

The term "an interface signal" used herein may be exchanged with "an input signal and/or an output signal" unless explicitly otherwise indicated herein.

The electrostatic protection method may further comprise the following features.

In an implementation, monitoring an interface signal of a timing control circuit TCON to determine whether the monitored signal is subjected to electrostatic interference comprises:

monitoring a ground signal of the TCON, and when an amplitude of the ground signal has a jitter, and the range in which the amplitude is changed exceeds a first jitter threshold, determining that the electrostatic interference is detected; and/or monitoring a data enabling DE signal of the TCON to detect whether the DE signal is enabled in advance in one cycle, and if so, determining that the electrostatic interference is detected; and/or detecting an input video signal of the TCON, and when an amplitude of the input video signal has a jitter, and the range in which the amplitude is changed exceeds a second jitter threshold, determining that the electrostatic interference is detected.

Here, the input video signal of the TCON comprises input Low-Voltage Differential Signaling (LVDS for short) of the TCON.

In an implementation, after determining that the electrostatic interference is detected by monitoring the interface signal of the level conversion circuit, the method further comprises: transmitting an indication signal for indicating that the electrostatic interference is detected to the timing control circuit TCON.

In an implementation, monitoring an interface signal of a level conversion circuit to determine whether the monitored signal is subjected to electrostatic interference comprises:

monitoring a ground signal of the level conversion circuit, and when an amplitude of the ground signal has a jitter, and the range in which the amplitude is changed exceeds a third jitter threshold, determining that the electrostatic interference is detected; and/or enabling an Over Current Protection (OCP for short) function of the level conversion circuit, and when it is monitored that output current exceeds a set current threshold for more than a set time period, determining that the electrostatic interference is detected; and/or when the timing control signal output by the level conversion circuit to the GOA circuit is buffered by a buffer and is then output to the GOA circuit, comparing an input signal and an output signal of the buffer, and if the output signal is different from the input signal, determining that the electrostatic interference is detected.

In an implementation, adjusting a timing control signal output by the TCON to a GOA circuit of an array substrate comprises:

causing the TCON not to output a clock signal CLK of next one or more frames to the GOA circuit; or outputting, by the TCON, a frame start signal Start Vertical (STV) of the next one or more frames to the GOA circuit, and causing the TCON not to output the clock signal CLK of the next one or more frames to the GOA circuit; or outputting, by the TCON, the frame start signal STV of the next one or more frames to the GOA circuit, causing the TCON not to output an active clock signal Active CLK of the next one or more frames to the GOA circuit, and outputting a dummy clock signal Dummy CLK of the next one or more frames to the GOA circuit, wherein the frame start signal is used to instruct the GOA circuit to perform pre-frame discharging before a frame starts; and the clock signal comprises the active clock signal and the dummy clock signal, wherein the active clock signal is used to instruct the GOA circuit to turn on one or more rows of row switches, and the dummy clock signal is used to instruct the GOA circuit to turn off one or more rows of row switches which have previously been turned on.

The GOA circuit has its own dedicated discharging and de-noising circuit. In addition, when the GOA circuit does not operate, discharging may also be realized through leakage current of a Metal-Oxide-Semiconductor Field-Effect Transistor (MOSFET). For some GOA circuits, a frame start signal STV is used as a total reset input, and pre-frame discharging is performed before each frame starts.

As shown in FIG. 3, according to another embodiment of the present disclosure, there is provided an electrostatic protection apparatus, comprising:

a detection circuit 301 configured to monitor an interface signal of a timing control circuit TCON and/or a level conversion circuit to determine whether the monitored signal is subjected to electrostatic interference; and a control circuit 302 configured to, when the electrostatic interference is detected, adjust a timing control signal output by the timing control circuit TCON to a gate driving GOA circuit of an array substrate, wherein the level conversion circuit connects the timing control circuit TCON to the gate driving GOA circuit of the array substrate, and is configured to perform level conversion on an output signal output by the timing control circuit TCON to the gate driving GOA circuit of the array substrate.

The electrostatic protection apparatus further comprises the following features.

In an implementation, the detection circuit may comprise a first detection sub-circuit configured to monitor an interface signal of a timing control circuit TCON to determine whether the monitored signal is subjected to electrostatic interference by:

monitoring a ground signal of the TCON, and when an amplitude of the ground signal has a jitter, and the range in which the amplitude is changed exceeds a first jitter threshold, determining that the electrostatic interference is detected; and/or monitoring a data enabling DE signal of the TCON to detect whether the DE signal is enabled in advance in one cycle, and if so, determining that the electrostatic interference is detected; and/or detecting an input video signal of the TCON, and when an amplitude of the input video signal has a jitter, and the range in which the amplitude is changed exceeds a second jitter threshold, determining that the electrostatic interference is detected.

Here, the input video signal of the TCON comprises input Low-Voltage Differential Signaling (LVDS for short) of the TCON.

In an implementation, the detection circuit may comprise a second detection sub-circuit further configured to, after determining that the electrostatic interference is detected by monitoring the interface signal of the level conversion circuit, transmit an indication signal for indicating that the electrostatic interference is detected to the timing control circuit TCON.

In an implementation, the second detection sub-circuit is configured to monitor an interface signal of a level conversion circuit to determine whether the monitored signal is subjected to electrostatic interference by:

monitoring a ground signal of the level conversion circuit, and when an amplitude of the ground signal has a jitter, and the range in which the amplitude is changed exceeds a third jitter threshold, determining that the electrostatic interference is detected; and/or enabling an Over Current Protection (OCP for short) function of the level conversion circuit, and when it is monitored that output current exceeds a set current threshold for more than a set time period, determining that the electrostatic interference is detected; and/or when the timing control signal output by the level conversion circuit to the GOA circuit is buffered by a buffer and is then output to the GOA circuit, comparing an input signal and an output signal of the buffer, and if the output signal is different from the input signal, determining that the electrostatic interference is detected.

In an implementation, the control circuit is configured to adjust a timing control signal output by the TCON to a gate driving GOA circuit of an array substrate by:

causing the TCON not to output a clock signal CLK of next one or more frames to the GOA circuit; or outputting, by the TCON, a frame start signal STV of the next one or more frames to the GOA circuit, and causing the TCON not to output the clock signal CLK of the next one or more frames to the GOA circuit; or outputting, by the TCON, the frame start signal STV of the next one or more frames to the GOA circuit, causing the TCON not to output an active clock signal Active CLK of the next one or more frames to the GOA circuit, and outputting a dummy clock signal Dummy CLK of the next one or more frames to the GOA circuit, wherein the frame start signal is used to instruct the GOA circuit to perform pre-frame discharging before a frame starts; and the clock signal comprises the active clock signal and the dummy clock signal, wherein the active clock signal is used to instruct the GOA circuit to turn on one or more rows of row switches, and the dummy clock signal is used to instruct the GOA circuit to turn off one or more rows of row switches which have previously been turned on.

According to yet another embodiment of the present disclosure, there is provided a liquid crystal display, comprising the electrostatic protection apparatus described above.

How to perform electrostatic detection in the TCON will be described below by way of example.

Figure 4:
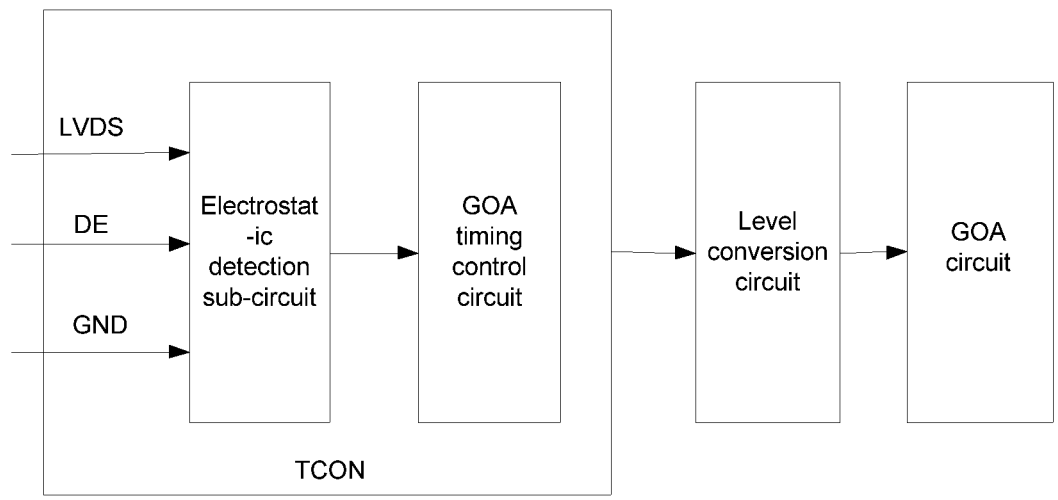
FIG. 4 is an exemplary diagram of monitoring electrostatic interference of a TCON circuit according to an embodiment of the present disclosure.

As shown in FIG. 4, after the level conversion circuit performs level conversion on an output signal of the TCON, the converted signal is output to the GOA circuit. An electrostatic detection sub-circuit may be added in the TCON circuit, and input signals of the electrostatic detection sub-circuit may comprise at least one of: low voltage differential signaling LVDS, a data enabling DE signal, and a ground signal GND.

The electrostatic detection sub-circuit determines whether electrostatic interference is detected by monitoring one or more of the input signals, and if the electrostatic interference is detected, transmits a control signal to a GOA timing control circuit.

Here, the electrostatic detection sub-circuit may monitor a jitter of the ground signal GND of the TCON, monitor an amplitude of the GND, and determine that the electrostatic interference is detected when the amplitude exceeds a set jitter range. The electrostatic detection sub-circuit may further monitor a periodic change of the DE signal input to the TCON. In a blanking region, the DE signal is generally pulled low, but when the input of the TCON is disturbed by electrostatic interference, the DE signal may be pulled high in advance. The electrostatic detection sub-circuit may further monitor an amplitude change of the input LVDS signal, and when electrostatic interference occurs, the LVDS at the system side may have a jitter. The electrostatic detection sub-circuit may monitor an amplitude of the jitter of the input LVDS signal of the TCON to determine whether the electrostatic interference occurs.

How to perform electrostatic detection in the level conversion circuit will be described below by way of example.

Figure 1:
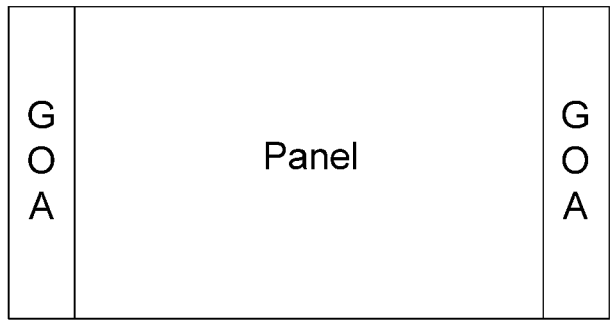
FIG. 1 is a schematic diagram of a GOA circuit in the related art.
Figures 1, 5:
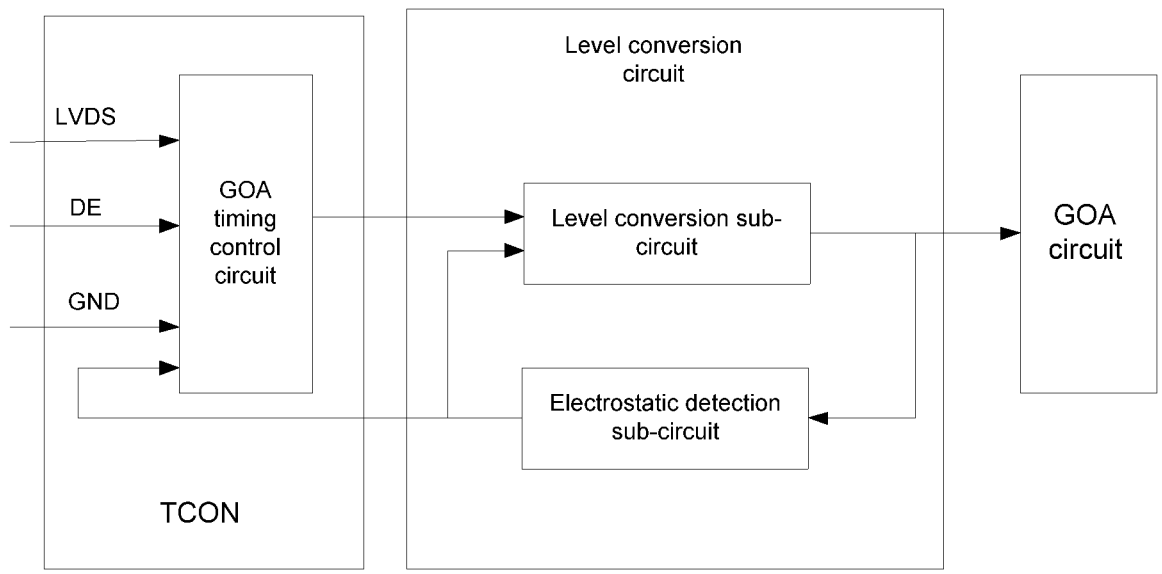
Figures 2, 5:
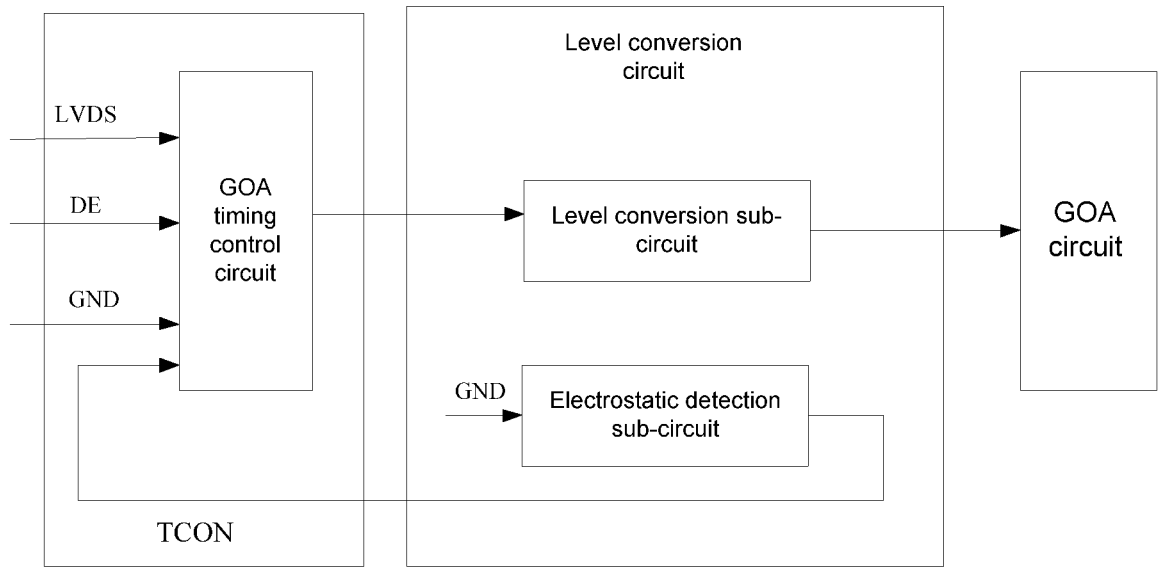
Figures 3, 5:
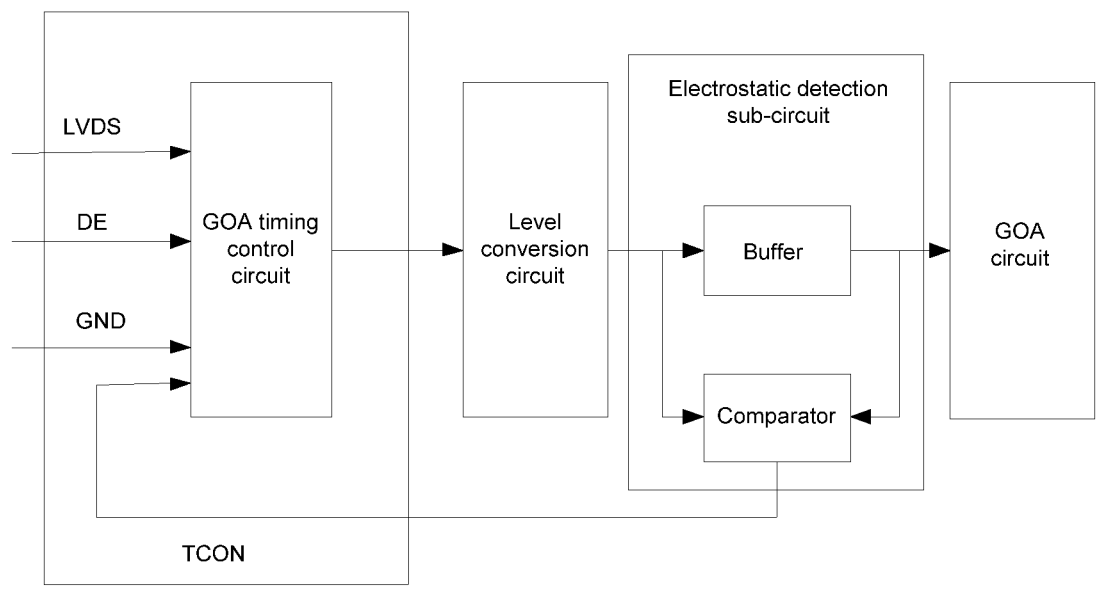

In an implementation, as shown in FIG. 5-1, after the level conversion circuit performs level conversion on the output signal of the TCON, the converted signal is output to the GOA circuit. An electrostatic detection sub-circuit is added in the level conversion circuit, and an input signal of the electrostatic detection sub-circuit comprises output current of the level conversion circuit. After the electrostatic detection sub-circuit detects electrostatic interference, the electrostatic detection sub-circuit may transmit an indication signal for notifying that the electrostatic interference is detected to the TCON.

An Over Current Protection (OCP for short) function of the level conversion circuit may be enabled to monitor large output current. A maximum amplitude and an abnormal time for the monitoring may be set. When the monitored output current exceeds the set amplitude for more than the set abnormal time period, it may be determined that electrostatic interference is detected. In this case, the output current may be turned off for a while, and then the output current is turned on and the monitoring continues.

In another implementation, as shown in FIG. 5-2, after the level conversion circuit performs level conversion on the output signal of the TCON, the converted signal is output to the GOA circuit. An electrostatic detection sub-circuit is added in the level conversion circuit, and an input signal of the electrostatic detection sub-circuit comprises a ground signal GND. After the electrostatic detection sub-circuit detects electrostatic interference, the electrostatic detection sub-circuit transmits an indication signal for notifying that the electrostatic interference is detected to the TCON.

Similarly to monitoring the ground signal in the TCON in the example shown in FIG. 4, the electrostatic detection sub-circuit in the level conversion circuit may monitor a jitter of the ground signal GND of the level conversion circuit, monitor an amplitude of the GND, and when the amplitude exceeds a set jitter range, determines that electrostatic interference is detected.

In still another implementation, as shown in FIG. 5-3, after the level conversion circuit performs level conversion on the output signal of the TCON, the converted signal is output to the GOA circuit. An electrostatic detection sub-circuit is added outside the level conversion circuit, and the electrostatic detection sub-circuit may comprise a buffer and a comparator. An output terminal of the level conversion circuit is connected to an input terminal of the buffer and an input terminal of the comparator. In other embodiments, the buffer and the comparator may also be integrated within the level conversion circuit.

The buffer is used to buffer an output signal of the level conversion circuit and then output the output signal to the GOA circuit. One input signal of the comparator is an output signal of the buffer, and the other input signal of the comparator is the output signal of the level conversion circuit. The comparator compares the two signals, and if a comparison result indicates that there is a difference between the two signals, the comparator transmits an indication signal for notifying that electrostatic interference is detected to the TCON circuit.

How the TCON adjusts the timing control signal output to the GOA circuit when the electrostatic interference is detected will be described below by way of several examples.

In an implementation, as shown in FIG. 6-1, when the electrostatic interference is detected, the TCON circuit enters a mute mode, and does not output a CLK signal of next one or more frames to the GOA circuit.

In another implementation, as shown in FIG. 6-2, the TCON outputs a frame start signal STV, and does not output the CLK signal of the next one or more frames to the GOA circuit. Here, the STV signal is used to instruct the GOA circuit to perform pre-frame discharging before a frame starts.

In still another implementation, as shown in FIG. 6-3, the TCON outputs the frame start signal STV of the next one or more frames to the GOA circuit, does not output an active clock signal Active CLK of the next one or more frames to the GOA circuit, and outputs a dummy clock signal Dummy CLK of the next one or more frames to the GOA circuit.

Here, the clock signal CLK comprises the active clock signal Active CLK and the dummy clock signal Dummy CLK, wherein the dummy clock signal Dummy CLK is located after the active clock signal Active CLK; and the active clock signal Active CLK is used to instruct the GOA circuit to turn on one or more rows of row switches, and the dummy clock signal Dummy CLK is used to instruct the GOA circuit to turn off one or more rows of row switches which have previously been turned on.

Although the embodiments disclosed in the present disclosure are as described above, the content is merely implementations used to facilitate the understanding of the present disclosure, and is not intended to limit the present disclosure. Any modification or variation in the form and details of the implementations may be made by those skilled in the art to which the present disclosure belongs without departing from the spirit and scope of the present disclosure. The patent protection scope of the present disclosure shall also be defined by the scope of the appended claims.

We claim:
1. An electrostatic protection method, comprising:
    monitoring an output signal of a level conversion circuit to determine whether the monitored signal is subjected to electrostatic interference; and
    when the electrostatic interference is detected, adjusting a timing control signal output by a timing control circuit to a gate driving circuit of an array substrate,
    wherein the level conversion circuit connects the timing control circuit to the gate driving circuit of the array substrate, and is configured to perform level conversion on an output signal output by the timing control circuit to the gate driving circuit of the array substrate; and
    wherein adjusting the timing control signal output by the timing control circuit to the gate driving circuit of the array substrate comprises:
        outputting, by the timing control circuit, a frame start signal of a next one or more frames to the gate driving circuit of the array substrate, causing the timing control circuit not to output an active clock signal of the next one or more frames to the grate driving circuit of the array substrate, and outputting a dummy clock signal of the next one or more frames to the gate driving circuit of the array substrate,
    wherein the frame start signal is used to instruct the gate driving circuit of the array substrate to perform pre-frame discharging before a frame starts; and
    wherein a clock signal comprises the active clock signal and the dummy clock signal, the active clock signal is used to instruct the gate driving circuit of the array substrate to turn on one or more rows of row switches, and the dummy clock signal is used to instruct the gate driving circuit of the array substrate to turn off one or more rows of row switches which were previously turned on.

2. The electrostatic protection method according to claim 1, wherein
    after determining that the electrostatic interference is detected by monitoring the output signal of the level conversion circuit, the method further comprises: transmitting an indication signal for indicating that the electrostatic interference is detected to the timing control circuit.

3. The electrostatic protection method according to claim 1, wherein the step of monitoring the output signal of the level conversion circuit to determine whether the monitored signal is subjected to electrostatic interference comprises:
    enabling an overcurrent protection function of the level conversion circuit, and when it is monitored that output current exceeds a set current threshold for more than a set time period, determining that the electrostatic interference is detected.

4. The electrostatic protection method according to claim 1, wherein the step of monitoring the output signal of the level conversion circuit to determine whether the monitored signal is subjected to electrostatic interference comprises:
when the timing control signal output by the level conversion circuit to the gate driving circuit of the array substrate is buffered by a buffer and is then output to the gate driving circuit of the array substrate, comparing an input signal and an output signal of the buffer, and if the output signal is different from the input signal, determining that the electrostatic interference is detected.

5. An electrostatic protection apparatus, comprising:
a detection circuit configured to monitor an output signal of a level conversion circuit to determine whether the monitored signal is subjected to electrostatic interference; and
a control circuit configured to, when the electrostatic interference is detected, adjust a timing control signal output by the timing control circuit to a gate driving circuit of an array substrate,
wherein the level conversion circuit connects the timing control circuit to the gate driving circuit of the array substrate, and is configured to perform level conversion on an output signal output by the timing control circuit to the gate driving circuit of the array substrate; and
wherein the control circuit is configured to adjust the timing control signal output by the timing control circuit to the gate driving circuit of the array substrate by:
outputting, by the timing control circuit, a frame start signal of a next one or more frames to the gate driving circuit of the array substrate, causing the timing control circuit not to output an active clock signal of the next one or more frames to the grate driving circuit of the array substrate, and outputting a dummy clock signal of the next one or more frames to the gate driving circuit of the array substrate,
wherein the frame start signal is used to instruct the gate driving circuit of the array substrate to perform pre-frame discharging before a frame starts; and
wherein a clock signal comprises the active clock signal and the dummy clock signal, the active clock signal is used to instruct the gate driving circuit of the array substrate to turn on one or more rows of row switches, and the dummy clock signal is used to instruct the gate driving circuit of the array substrate to turn off one or more rows of row switches which were previously turned on.

6. The electrostatic protection apparatus according to claim 5, wherein the detection circuit comprises a second detection sub-circuit configured to, after determining that the electrostatic interference is detected by monitoring the output signal of the level conversion circuit, transmit an indication signal for indicating that the electrostatic interference is detected to the timing control circuit.

7. A liquid crystal display, comprising the electrostatic protection apparatus according to claim 5.

8. The electrostatic protection apparatus according to claim 6, wherein the second detection sub-circuit is configured to monitor the output signal of the level conversion circuit to determine whether the monitored signal is subjected to electrostatic interference by:
enabling an overcurrent protection function of the level conversion circuit, and when it is monitored that output current exceeds a set current threshold for more than a set time period, determining that the electrostatic interference is detected; and/or
when the timing control signal output by the level conversion circuit to the gate driving circuit of the array substrate is buffered by a buffer and is then output to the gate driving circuit of the array substrate, comparing an input signal and an output signal of the buffer, and if the output signal is different from the input signal, determining that the electrostatic interference is detected.

* * * * *